United States Patent
Duclos (10) Patent No.: US 7,888,619 B2
(45) Date of Patent: Feb. 15, 2011

(54) MACHINE FOR THE TREATMENT OF BOTTLES THAT ARE EQUIPPED WITH AN INTERCHANGEABLE CONNECTION CARTRIDGE

(75) Inventor: Yves-Alban Duclos, Octeville sur Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 1089 days.

(21) Appl. No.: 11/630,441

(22) PCT Filed: Jun. 17, 2005

(86) PCT No.: PCT/EP2005/052811

§ 371 (c)(1),
(2), (4) Date: Dec. 22, 2006

(87) PCT Pub. No.: WO2006/000539

PCT Pub. Date: Jan. 5, 2006

(65) Prior Publication Data

US 2008/0035613 A1 Feb. 14, 2008

(30) Foreign Application Priority Data

Jun. 24, 2004 (FR) .................................. 04 51328

(51) Int. Cl.
*B23K 10/00* (2006.01)
(52) U.S. Cl. ............................. 219/121.47; 219/121.48; 219/121.51; 422/21; 427/488
(58) Field of Classification Search ............ 219/121.36, 219/121.47, 121.52, 121.59, 121.48, 121.5, 219/686; 427/488; 422/23; 118/723 R, 118/723 MW, DIG. 3
See application file for complete search history.

(56) References Cited

U.S. PATENT DOCUMENTS

| 4,869,203 | A | * | 9/1989 | Pinkhasov | ............ 118/723 VE |
| 5,521,351 | A | | 5/1996 | Mahoney et al. | |
| 6,037,562 | A | * | 3/2000 | Awakowicz et al. | ..... 219/121.59 |
| 6,276,296 | B1 | * | 8/2001 | Plester | .................... 118/723 R |
| 6,559,284 | B1 | * | 5/2003 | Ageland et al. | ............. 530/359 |
| 6,805,931 | B2 | * | 10/2004 | Nagashima | ................ 428/36.6 |

FOREIGN PATENT DOCUMENTS

| FR | 2 783 667 | 3/2000 |
| JP | 58 164788 | 9/1983 |
| WO | WO 95/22413 | 8/1995 |
| WO | WO 01/31680 | 5/2001 |
| WO | WO 02/10473 | 2/2002 |

* cited by examiner

*Primary Examiner*—Mark H Paschall
(74) *Attorney, Agent, or Firm*—Young & Thompson (57) ABSTRACT

A machine for the treatment of containers, includes at least one container-treatment station. The machine is of the type in which each treatment station comprises a cover having a nozzle which is provided with: gripping elements for seizing the outside of the container, and impervious connection elements between the inside of the container and a vacuum pumping chamber which is provided in the cover. In addition, the machine is of the type in which the impervious connection elements include a cartridge which is mounted in the cover. The cartridge includes an axial segment, known as the connection segment, which extends inside the pumping chamber and which is equipped with radial holes. The pumping chamber is connected to the interior of the cartridge via the radial holes.

10 Claims, 5 Drawing Sheets

MACHINE FOR THE TREATMENT OF BOTTLES THAT ARE EQUIPPED WITH AN INTERCHANGEABLE CONNECTION CARTRIDGE

The present invention relates to a machine for the treatment of containers, such as bottles, flasks or the like.

The present invention relates more particularly to a machine for the treatment of containers by the depositing of a barrier-forming internal coating by means of a microwave plasma, especially for the purpose of allowing the packaging of oxidation-sensitive liquids in the containers, said machine comprising at least one treatment station for a container equipped with a neck, of the type in which each treatment station comprises a treatment enclosure which is intended to contain a container, and a cover which is mounted axially slidably with respect to the enclosure and which is provided with a nipple equipped with gripping means for grasping the container externally by its neck, so as to allow the axial insertion of the container into the enclosure via a corresponding aperture, and equipped with leaktight connection means between the interior of the container and a vacuum-pumping chamber which is arranged in the cover, of the type in which the leaktight connection means comprise a cartridge which is mounted in the cover, which has a substantially tubular shape coaxial with respect to the neck of the container and which is in leaktight contact with the lip of the container grasped by the gripping means.

In this type of machine, the container is generally arranged right way up, that is to say with the neck directed upward, the nipple sliding axially from the top downward in order to grasp the container and bring it into the enclosure.

In general, the connection cartridge consists of a cylindrical sleeve which is provided with a sealing ring at its lower end and which is inserted axially into the nipple, so as to issue directly at a lower axial end into the vacuum-pumping chamber.

During the treatment of the container, a microwave field is emitted inside the treatment enclosure, and this field is propagated toward the pumping chamber through the sleeve.

The microwaves which are propagated inside the sleeve and inside the pumping chamber give rise there to deposits of particles of barrier material (carbon, silica and the like, depending on the reaction fluid used), thus polluting the inner walls of the sleeve and of the pumping chamber and even the inner walls of the pumping circuit.

For this reason, it is necessary frequently to carry out a stop of the machine and a cleaning of the cartridge and of the pumping chamber.

The present invention is aimed especially at overcoming this disadvantage in a simple, efficient and economical way.

To achieve this, the invention proposes a treatment machine of the type described above, characterized in that the cartridge comprises an axial portion, called a connection portion, which extends inside the pumping chamber and which is provided with radial ports, and in that the pumping chamber communicates with the interior of the cartridge via the radial ports, the nominal dimensions of each port being capable of preventing the diffusion toward the pumping chamber of microwaves emitted inside the container during treatment.

According to other characteristics of the invention:
the axial wall of the connection portion comprises at least one window, and each window is shut off by means of an attached axial wall element in which the ports are arranged;
the axial wall element consists of a perforated cuff attached inside the cartridge;
the cartridge comprises an axial portion forming a tubular spacer which is inserted axially between the lip of the container and the connection portion and which is fastened to an associated axial end of the connection portion;
the cartridge comprises an annular sealing ring which makes the leaktight connection between the cartridge and the lip of the container and which is fastened to the opposite axial end of the spacer to the connection portion;
the gripping means comprise a tubular supporting cuff which is coaxial with respect to the neck of the container and which is mounted in a receptacle of the cover, and the concave axial wall of the supporting cuff comprises a shoulder which is intended to come to bear axially against the annular sealing ring of the cartridge;
the cartridge comprises, on the opposite side to the container, an axial end portion, called a junction portion, which possesses a solid axial wall and which is in leaktight contact at its free axial end with the body of a device intended for injecting reaction fluid into the container during treatment;
the junction portion has substantially cylindrical shape, and the cartridge comprises a cylindrical sleeve which is arranged against the concave axial wall of the junction portion and which extends substantially over the entire axial length of the junction portion;
the junction portion and the connection portion are produced in one piece, and they form the main body of the cartridge;
the cartridge is mounted in a complementary receptacle of the cover, in that the cover comprises a locking member which is provided with a radial bearing surface movable between a locked position and a release position, and the cartridge comprises an outer radial collar which is intended to be clamped axially between an associated portion of the cover and the bearing surface of the locking member in the locked position, so as to retain the cartridge in the position mounted in the receptacle of the cover.

Other characteristics and advantages of the invention will become apparent from a reading of the following detailed description to understand which reference will be made to the accompanying drawings in which.

In the following description, identical, similar or like elements will be designated by the same reference numerals.

Figure 1:
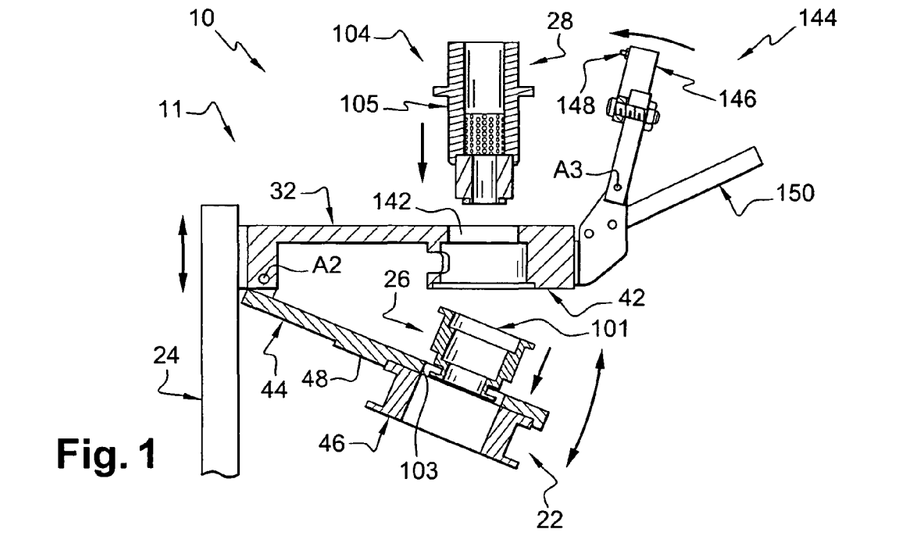
FIG. 1 is an exploded view in partial axial section which illustrates diagrammatically a treatment station of the machine according to the invention when the cover occupies a high axial transfer position with respect to the frame.

FIG. 1 partially illustrates a machine 10 for the treatment of containers 12 which is produced according to the teachings of the invention.

The machine 10 is intended for carrying out the depositing of a barrier-forming internal coating by means of a microwave plasma, especially for the purpose of allowing the packaging of an oxidation-sensitive liquid in the containers 12.

Conventionally, the machine 10 comprises a plurality of treatment stations 11 which may be circumferentially distributed uniformly on a rotary support (not illustrated), each treatment station 11 being intended for treating one container 12 at a time.

A single treatment station 11 has been illustrated partially in the figures.

Figure 3:
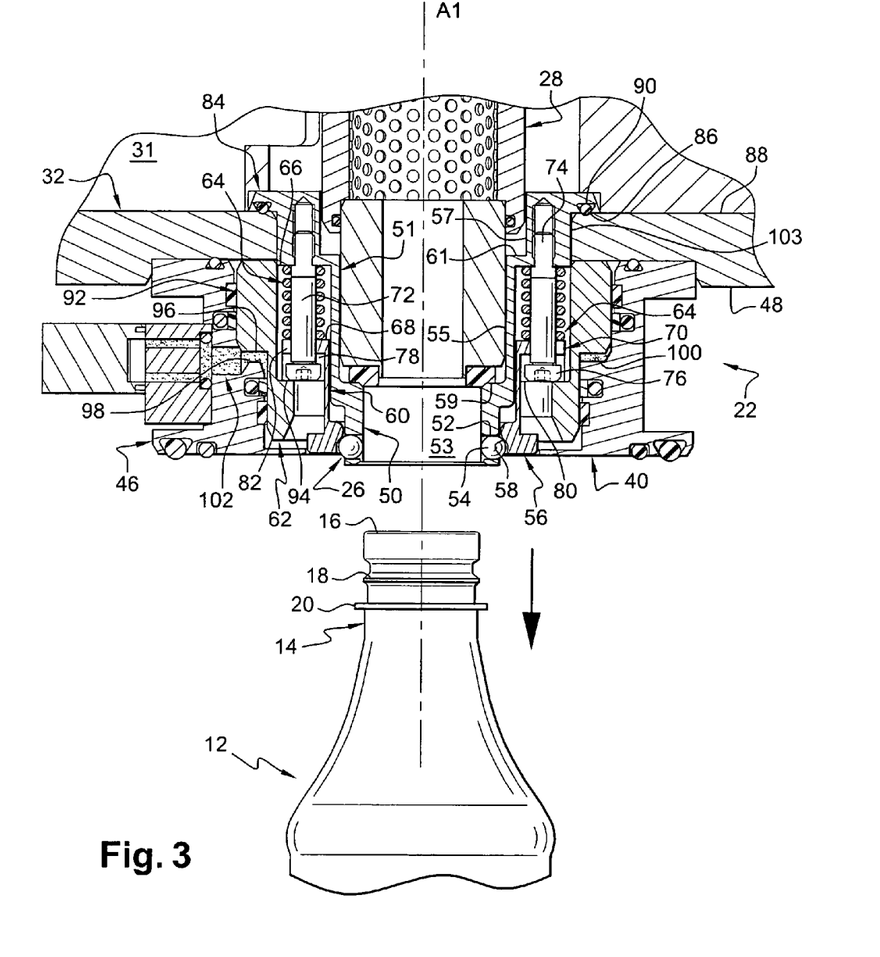
FIG. 3 is a view in axial section which partially illustrates the cover when the gripping means are ready to grasp the neck of a container.

As may be seen particularly in FIG. 3, each container 12 is equipped at its upper axial end with a neck 14 which delimits an upper aperture, the rim of which forms the lip 16 of the container 12.

The neck 14 is equipped with a first outer radial collar 18 and with a second outer radial collar 20 arranged under the first outer radial collar 18.

Advantageously, when the container 12 is a bottle, the first outer radial collar 18 may consist of the tamper-proof ring which is generally present on the neck of the bottle and is intended for cooperating with a tamper-proof hoop present on the stopper and which tears when the container is opened.

Each treatment station 11 comprises a nipple 22 of substantially cylindrical shape which is mounted slidably along a substantially vertical axis A1 with respect to a fixed frame 24 of the machine 10.

In the rest of the description, a vertical axial orientation along the sliding axis A1 will be used in a nonlimiting way, this corresponding to an orientation from the top downward in the figures.

Elements will be designated as radial or transverse as a function of their arrangement with respect to the sliding axis A1.

The nipple 22 comprises gripping means 26 for grasping the container 12 externally by its neck 14 and connection means 28 for connecting the interior of the container 12 in a leaktight manner to a vacuum-pumping circuit 30.

Figure 4:
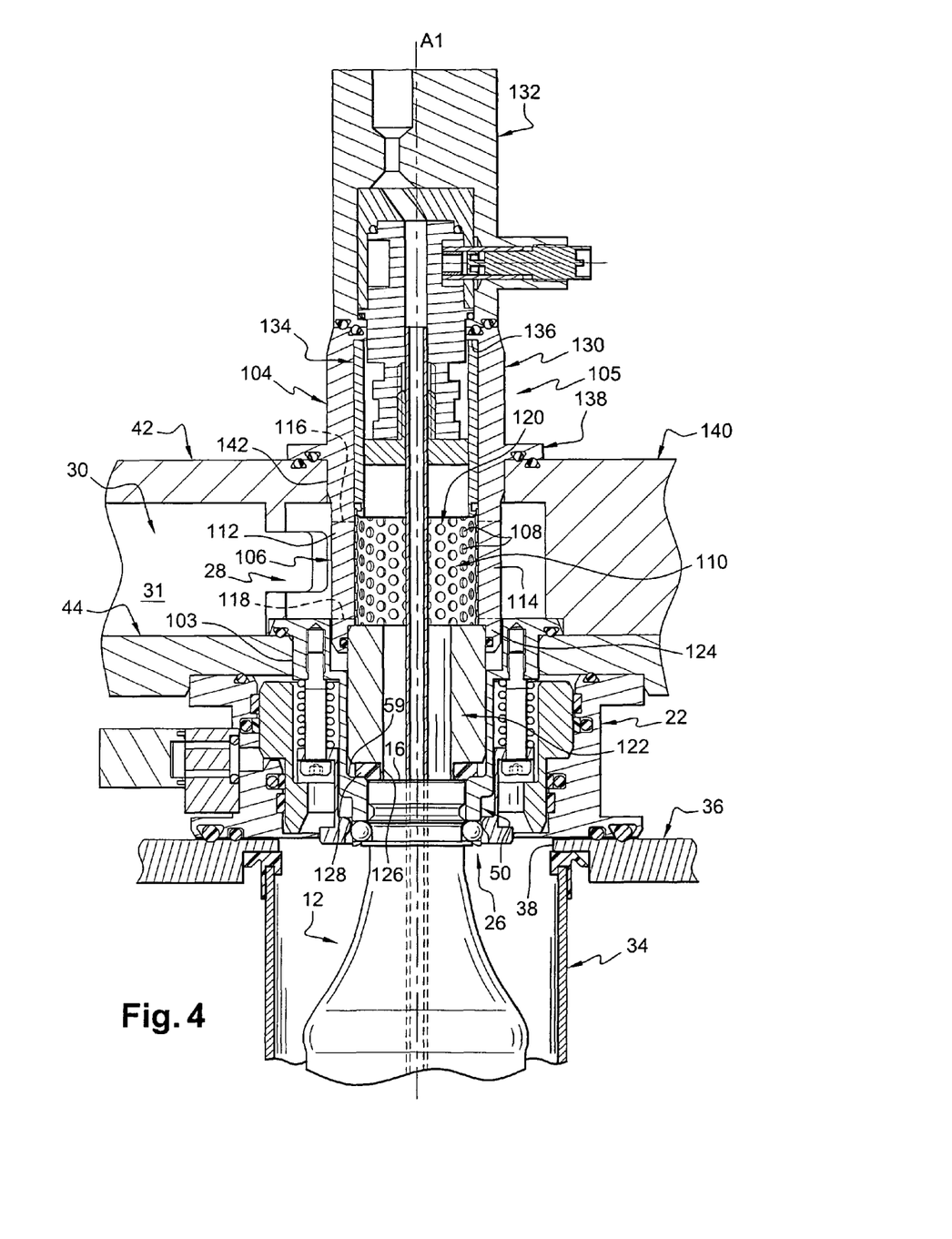
FIG. 4 is a view in axial section which partially illustrates the cover equipped with a cartridge and with a reaction fluid injector when the cover occupies its low treatment position and when it closes the treatment enclosure, a container being grasped by the gripping means.

According to the embodiment illustrated here, the nipple 22 is carried by a cover 32, and the cover 32 is mounted axially slidably on the frame 24 between a high transfer position, which is illustrated in FIGS. 1 and 3, and a low treatment position, which is illustrated in FIG. 4.

The figures illustrate a portion of the pumping circuit 30, said portion consisting of a pumping chamber 31 arranged inside the cover 32 and intended to be connected to the container 12 by the connection means 28.

Each treatment station 11 also comprises a treatment enclosure 34 which is fastened to the frame 24.

The treatment enclosure 34 comprises, in an upper transverse face 36, a corresponding aperture 38 which is intended to allow the axial insertion of the container 12 into the enclosure 34.

The nipple 22 comprises an annular closing portion 40 which is intended to come to bear axially, leaktight, against a corresponding portion of the upper transverse face 36 of the enclosure 34 so as to close said corresponding aperture 38.

Figure 2:
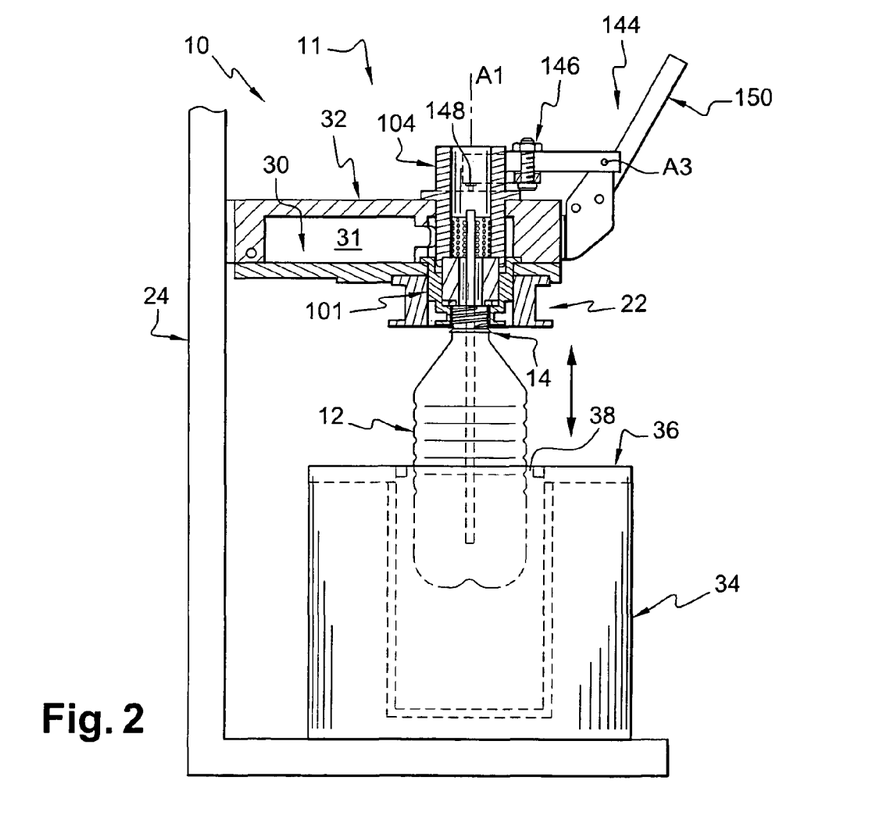
FIG. 2 is a view, similar to the preceding one, which illustrates diagrammatically the cover in an intermediate axial position when the container is grasped by gripping means and partially introduced into a treatment enclosure.
Figure 5:
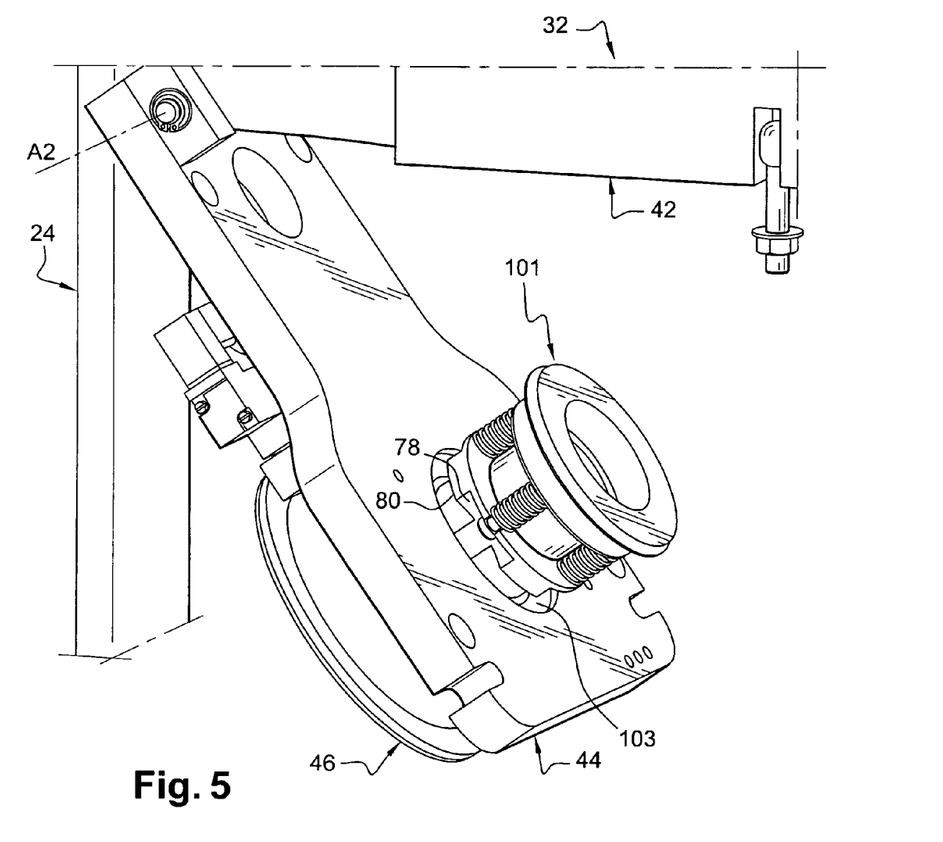
FIG. 5 is a perspective view which partially illustrates the lower cap of the cover in the downwardly tilted position, the subassembly which forms the gripping means being mounted partially in its receptacle.

The cover 32 comprises, here, an upper cap 42, which is mounted slidably on the frame 24, and a lower cap 44, which is mounted pivotably about a transverse axis A2 with respect to the upper cap 42, between an open demounting position, which is illustrated in FIGS. 1 and 5, and a closed position of use, which is illustrated particularly in FIG. 2.

The use of the demounting position will be explained later.

The nipple 22 comprises a substantially cylindrical annular main body 46 which is fastened at its upper axial end to the lower transverse face 48 of the cover 32.

The lower transverse end face of the main body 46 forms, here, the annular closing portion 40 of the nipple 22.

The gripping means 26 comprise a supporting cuff 50 which is tubular and coaxial with respect to the neck 14 of the container 12, which is fixed with respect to the main body 46 of the nipple 22 and which is provided with a series of open-ended radial drillholes 52, each intended for receiving a ball 54 movable radially between an inner gripping position, which is illustrated in FIG. 4, and an outer release position which is illustrated in FIG. 3.

The radial drillholes 52, here, are of substantially cylindrical shape and each form a receptacle for a ball 54.

Preferably, the radial drillholes 52 are arranged in the vicinity of the lower axial end of the supporting cuff 50, and they are distributed angularly in a uniform manner.

When the balls 54 occupy their inner radial gripping position, they are intended for cooperating with the neck 14 of the container 12 so as to grasp the container 12.

When the balls 54 occupy their outer radial release position, they are intended for allowing the withdrawal of the container 12 with respect to the nipple 22.

According to the embodiment illustrated here, the concave axial wall 51 of the supporting cuff 50 is tiered axially, so that it comprises a cylindrical lower axial end portion 53, a cylindrical intermediate portion 55 and a cylindrical upper axial end portion 57 which are adjacent and which have respective inside diameters increasing upward.

The cylindrical lower axial end portion 53 delimits with the intermediate portion a shoulder 59 oriented upward.

The intermediate portion delimits with the upper axial end portion 57 a radial surface 61 oriented upward.

Advantageously, the axial dimension of the cylindrical lower axial end portion 53 is substantially equal to the axial dimension of the neck 14 of the container 12 from the second outer radial collar 20 as far as the lip 16, in such a way that, when the container 12 is grasped by the gripping means 26, the lip 16 is arranged substantially at the same height as the shoulder 59 and that the balls 54 cooperate by contact with the first outer radial collar 18 for the purpose of stressing the container 12 axially upward.

The gripping means 26 comprise, here, a control cuff 56 which is tubular, coaxial and external with respect to the supporting cuff 50.

This control cuff 56 is mounted axially slidably with respect to the supporting cuff 50 between a locked lower axial position, which is illustrated in FIG. 4, and an unlocked upper axial position, which is illustrated in FIG. 3.

The control cuff 56 comprises a frustoconical bearing surface 58 which is arranged on its concave axial wall 60 and which is intended for cooperating with the balls 54 so as to stress these radially toward their gripping position when the control cuff 56 slides from its unlocked position toward its locked position.

Conversely, when the control cuff 56 occupies its unlocked position, the balls 54 are free to be displaced radially between their gripping position and their release position.

The nipple 22 comprises controlled drive means 62 capable of causing the axial sliding of the control cuff 56 toward at least one of its two specific axial positions, that is to say the locked axial position and the unlocked axial position.

Advantageously, the gripping means 26 comprise at least one elastic return element 64 which stresses the control cuff 56 axially toward its locked position.

The drive means 62 are intended for causing the sliding of the control cuff 56 from its locked position toward its unlocked position counter to the return element 64.

According to the embodiment illustrated here, the gripping means 26 comprise a plurality of return elements 64 consisting of helical compression springs.

The springs 64 are distributed angularly in a uniform manner, and they are interposed axially between an annular radial surface 66 of the supporting cuff 50, said surface being oriented downward, and a confronting annular radial surface 68 consisting of the upper face of an outer radial collar 70 belonging to the control cuff 56.

The outer radial collar 70 is arranged, here, at the upper axial end of the control cuff 56.

Each spring 64 is wound around an axial screw 72 which passes through the outer radial collar 70 of the control cuff 56 and which is screwed at its threaded upper end 74 into the annular radial surface 66 of the supporting cuff 50.

Each screw 72 comprises at its lower end a head 76 which is housed axially in an associated notch 78 formed in the radial bearing surface 80 consisting of the lower radial surface of the outer radial collar 70 of the control cuff 56.

It will be noted that the axial depth of the notch 78 is greater than the axial height of the head 76.

Each notch 78 is open radially outward, as may be seen particularly in FIG. 5.

Moreover, the outer radial collar 70 of the control cuff 56 comprises, in each notch 78, a slot 82 which is open radially outward and which allows the passage of the associated screw 72 through the outer radial collar 70.

Advantageously, the supporting cuff 50 comprises, at its upper axial end, an outer radial collar 84 which extends radially beyond the outside diameter of the control cuff 56.

The outer radial collar 84 of the supporting cuff 50 comprises a lower annular radial surface 86 which is intended to come to bear axially against an upper transverse surface 88 of the lower cap 44, in such a way that the outer radial collar 84 can be clamped axially between the upper cap 42 and the lower cap 44 of the cover 32 for the purpose of retaining the supporting cuff 50 axially on the cover 32.

The lower annular radial surface 86 comprises, here, a receptacle for an O-ring 90 aimed at ensuring leaktightness of contact between the outer radial collar 84 and the associated upper transverse surface 88 of the lower cap 44.

Advantageously, the drive means 62 of the control cuff 56 comprise a pneumatic or hydraulic jack which is provided with a piston 92 connected to the control cuff 56 axially slidably at least in the unlocking direction.

The piston 92 consists here of a tubular cuff which is coaxial and external with respect to the control cuff 56.

The piston 92 comprises, in its concave axial wall, an inner radial surface 94 which is oriented upward and which is intended to come to bear axially against an associated radial bearing surface 80 of the control cuff 56 in order to allow the control cuff 56 to be driven by the piston 92 when the piston 92 is displaced axially upward.

The radial bearing surface 80 consists, here, of the lower radial surface of the outer radial collar 70 of the control cuff 56.

The piston 92 comprises, in its convex axial wall, an outer radial shoulder 96 which is oriented downward and which, with a confronting radial bearing surface 98 arranged in the main body 46 of the nipple 22, axially delimits a control chamber 100 of the piston 92.

The main body 46 of the nipple 22 comprises, here, a compressed-air supply duct 102 which is connected to a pressure source (not illustrated). Thus, the increase in pressure inside the control chamber 100 causes the upward sliding of the piston 92, thereby bringing about the sliding of the control cuff 56 toward its unlocked position.

It will be noted that the axial stroke of the piston 92 and therefore of the control cuff 56 may be very short, for example of the order of 2.5 mm.

Advantageously, the supporting cuff 50, the balls 54, the control cuff 56, the springs 64, the screws 72 and the O-ring 90 are preassembled so as to form an interchangeable subassembly 101 which can thus be mounted in the lower cap 44 of the cover 32 in a single operation.

For this purpose, the lower cap 44 of the cover 32 comprises a cylindrical receptacle 103 which issues coaxially into the main body 46 of the nipple 22.

The subassembly 101 is inserted axially from the top downward into the receptacle 103 of the lower cap 44, until the outer radial collar 84 of the supporting cuff 50 comes to bear axially against the upper transverse surface 88 of the lower cap 44.

The subassembly 101 is mounted, clamped axially between a bearing surface belonging to the upper cap 42 and the upper transverse surface 88 of the lower cap 44.

The connection means 28 equipping the nipple 22 according to the invention are now described.

The connection means 28 consist of a removable subassembly, called a cartridge 104, which has a substantially tubular shape coaxial with respect to the neck of the container 12.

According to the teachings of the invention, the cartridge 104 comprises an axial portion, called a connection portion 106, which extends inside the pumping chamber 31 and which is provided with radial ports 108.

According to another characteristic of the invention, the pumping chamber 31 communicates with the interior of the cartridge 104 solely through the radial ports 108, the nominal dimensions of each port 108 being capable of preventing the diffusion toward the pumping chamber 31 of microwaves emitted inside the container 12 during treatment.

The cartridge 104 comprises a tubular main body 105, the lower axial end portion of which forms the connection portion 106 here.

According to the embodiment illustrated here, the connection portion 106 comprises two diametrically opposed windows 110 which are cutout in its axial wall.

Each window 110 is delimited circumferentially by two axial pillars 112, 114 and axially by two radial rims 116, 118.

Each window 110 is shut off by means of an attached axial wall element 120 in which the radial ports 108 are arranged.

Advantageously, the attached axial wall element 120 consists of a perforated cuff which is coaxial with respect to the connection portion 106, which is produced in one piece and which is inserted axially into the cartridge 104 so as to shut off the two windows 110.

The perforated cuff 120 comprises a multiplicity of identical radial ports 108 which extend over its entire axial surface.

The perforated cuff 120 is produced, for example, from metal.

It will be noted that the nominal dimension of the passage cross section of each radial port 108 and the radial thickness of the perforated cuff 120 are selected so as to prevent the diffusion toward the pumping chamber 31 of microwaves emitted inside the container 12 during treatment, while at the same time minimizing the pressure drops during vacuum pumping.

The cartridge 104 comprises a tubular spacer 122 which is force-fitted axially into the lower axial end 124 of the connection portion 106.

The spacer 122 is inserted axially between the lip 16 of the container 12 and the main body 105 of the cartridge 104.

The lower axial end 126 of the spacer 122 is provided with an annular sealing ring 128 which is intended to make a leaktight connection between the cartridge 104 and the interior of the container 12.

Advantageously, when the cartridge 104 is mounted in the cover 32, the annular seal 128 comes to bear axially, leaktight, both against the inner shoulder 59 of the supporting cuff 50 and against the lip 16 of the container 12.

The spacer 122 is produced, for example, from thermoplastic.

According to the embodiment illustrated here, the main body 105 of the cartridge 104 comprises an upper axial end portion, called a junction portion 130, which extends the connection portion 106 upward.

The junction portion 130 possesses a solid axial wall, and it is in leaktight contact at its free upper axial end with the body of an injector 132 intended for injecting reaction fluid into the container 12 during treatment. In a known way, the reaction fluid is, for example, based on acetylene when the barrier coating is to be a carbon-containing material.

The cartridge 104 comprises a cylindrical sleeve 134 which is arranged against the concave axial wall of the junction portion 130 and which extends substantially over the entire axial length of the junction portion 130.

According to the embodiment illustrated here, the cylindrical sleeve 134 is mounted in axial abutment against an associated radial surface 136 which is oriented downward and which is arranged in the vicinity of the upper axial end of the junction portion 130.

The perforated cuff 120 is retained axially inside the cartridge 104 at the top by the lower axial end of the cylindrical sleeve 134 and at the bottom by the upper axial end of the spacer 122.

The junction portion 130 is provided with an outer radial collar 138 which comes to bear axially, leaktight, against the upper transverse surface 140 of the cover 32 when the cartridge 104 is mounted in the cover 32.

The cartridge 104 is intended, here, to be inserted axially, from the top downward, into a cylindrical receptacle 142 complementary to the cover 32.

The cylindrical receptacle 142 consists of a hole which is arranged in the upper cap 42 so as to confront axially the receptacle 103 intended for receiving the supporting cuff 50 of the gripping means 26.

Figure 6:
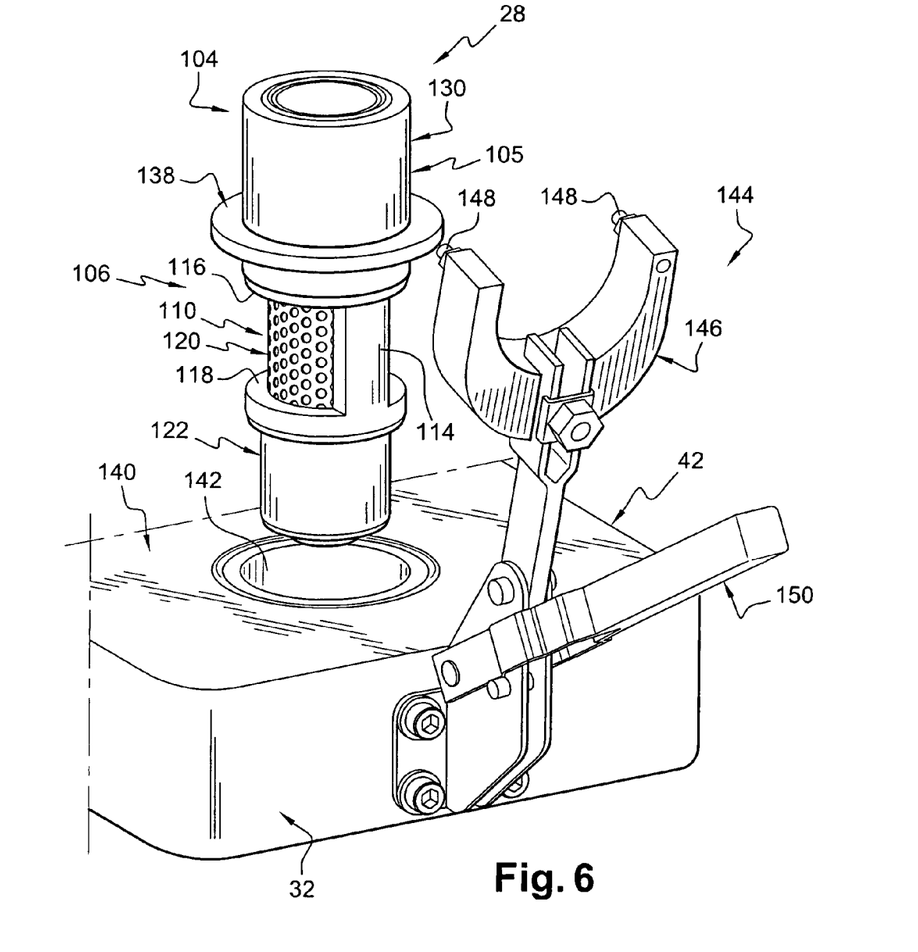
FIG. 6 is a perspective view which partially illustrates the upper cap of the cover before the mounting of the cartridge, the locking member of the cartridge occupying its release position.

The cover 32 is equipped with a locking member 144 which comprises a fork 146 mounted pivotably about a transverse axis A3 between an angular locked position, which is illustrated in FIG. 2, and an angular release position, which is illustrated in FIGS. 1 and 6.

The fork 146 has substantially a U-shape which extends in a transverse plane in the locked position and which delimits a notch substantially complementary to the outer shape of the junction portion 130 of the cartridge 104.

The lower transverse face of the fork 146, in the locked position, is equipped with radial bearing means 148 consisting, here, of two studs which extend vertically downward and which form respectively, at their lower axial ends, two transverse bearing surfaces for coming to bear axially against the upper radial face of the outer radial collar 138 of the junction portion 130. The radial bearing means 148, consisting of the two studs, are therefore movable between a locked position and a cartridge release position, depending on the position of the fork 146.

The studs 148 are arranged, here, in the vicinity of the free ends of the fork 146.

Preferably, each stud 148 consists of a screw which is screwed into the lower transverse face of the fork 146 and which comprises a head forming a bearing surface.

Thus, it is possible to set the height of the bearing surfaces of the fork 146 on the outer radial collar 138 accurately by screwing to a greater or lesser extent each screw which forms a bearing means 148.

The locking member 144 is equipped with a control lever 150 which controls the pivoting of the fork 146 between its two angular positions.

The gripping means 26 and the connection means 28 equipping the treatment machine 10 according to the invention function as follows.

As explained above, the subassembly 101 is formed by assembling the control cuff 56 on the supporting cuff 50 together with the balls 54, the springs 64 and the screws 72.

Similarly, the elements forming the cartridge 104, that is to say its main body 105, the sleeve 134, the perforated cuff 120, the spacer 122 and the sealing rings equipping it, are assembled beforehand.

The lower cap 44 of the cover 32 is opened by causing it to pivot downward about its axis A2 so as to allow the axial insertion of the subassembly 101 from the top downward into the associated receptacle 103, as is illustrated in FIGS. 1 and 5.

This operation is carried out when the cover 32 occupies its high transfer position.

The lower cap 44 can then be reclosed by causing it to pivot upward against the upper cap 42, so that the subassembly 101 is then clamped axially between the lower cap 44 and the upper cap 42, as illustrated in FIGS. 2, 3 and 4.

With the locking member 144 occupying its release position, the cartridge 104 is inserted axially, from the top downward, into the associated receptacle 142, until the outer radial collar 138 of the junction portion 130 comes to bear axially against the upper transverse surface 140 of the upper cap 42.

Action on the control lever 150 subsequently causes the pivoting of the fork 146 toward its locked position, as illustrated in FIG. 2, thus blocking the cartridge 104 axially in its mounted position.

It will be noted that, in the mounted position of the cartridge 104, the annular seal 128, which equips the lower axial end 126 of the spacer 122, comes to bear axially, leaktight, against the inner shoulder 59 of the supporting cuff 50 of the subassembly 101.

The body of the injector 132 can then be displaced axially downward so as to come to bear axially, leaktight, against the upper axial end of the junction portion 130 of the cartridge 104, as illustrated in FIG. 4.

It will be noted that, to simplify the illustration, the elements of the injector 132 have not been illustrated in the other figures.

At this stage, with the gripping means 26 and the connection means 28 being mounted on the cover 32, they are ready to function.

The phase of gripping a container 12 proceeds as follows.

The container 12 to be grasped is placed axially under the nipple 22, for example by means of a feed wheel (not illustrated), as illustrated in FIG. 3.

The control cuff 56 is controlled from its gripping position as far as its release position, as illustrated in FIG. 3, by means of the piston 92, in order to allow the insertion of the neck 14 of the container 12 into the supporting cuff 50.

Control means (not illustrated) cause the axial sliding of the cover 32 downward, until the neck 14 of the container 12 is received axially inside the cylindrical lower axial end portion 53 of the supporting cuff 50.

With the pressure in the control chamber 100 of the piston 92 being released, the control cuff 56 is driven toward its locked position under the action of the springs 64, thus stressing the balls 54 radially toward their gripping position against the axial wall of the neck 14 of the container 12, as illustrated in FIG. 4.

The radial bearing of the balls 54 against the first outer radial collar 18 stresses the container 12 slightly upward, so that the lip 16 comes closely to bear axially, leaktight, against the annular seal 128 equipping the spacer 122.

At this stage, the container 12 is grasped by the gripping means 26, thus allowing the cover 32 to continue its axial downward sliding, so as to introduce the container 12 axially into the enclosure 34 in order to make it possible to treat it.

The cover 32 descends as far as its axial treatment position, illustrated in FIG. 4, in which the nipple 22 closes the enclosure 34 in a leaktight manner.

In the axial treatment position, the vacuum pumping of the interior of the container 12 can commence, as can the treatment of the container 12.

After the treatment of the container 12, the cover 32 is controlled so as to slide toward its high transfer position, and the control cuff 56 is controlled into its release position, in order to allow the treated container 12 to be discharged from the machine.

The gripping means 26 and the cover 32 can then be controlled so as to grasp a new container 32 to be treated, in the same way as described above.

During the treatment of the container 12, the microwaves emitted inside the enclosure 34 cause deposits of carbon on the inner axial faces of the cartridge 104.

By virtue of the connection portion 106 and of the perforated cuff 120, the microwave field is confined within the cartridge 104, thus preventing carbon from being deposited in the pumping chamber 31.

After the treatment of a specific number of containers 12, the cartridge 104 can be demounted so as to make it possible to clean the surfaces which have undergone repeated deposits of carbon.

In the machine 10 according to the invention, the demounting of the cartridge 104 is facilitated since it is sufficient to cause the body of the injector 132 to slide upward axially, the latter also requiring cleaning, and then to cause the fork 146 to pivot toward its release position. The cartridge 104 can then be removed manually, without a tool, and can be replaced just as easily.

Advantageously, a replacement cartridge 104 may be provided so as to make it possible to clean the used cartridge 104 in parallel during the functioning of the machine 10.

It will be noted that the depositing of carbon inside the cartridge 104 decreases exponentially upward. Consequently, the depositing of carbon is concentrated mainly on the concave axial surface of the spacer 122.

The cleaning of the cartridge 104 may therefore be limited to the cleaning of the spacer 122 and of its annular seal 128.

The gripping means 26 according to the invention have the advantage of being arranged outside the microwave field so that they do not undergo any carbon deposit.

Since the drive means 62 of the control cuff 56 are mounted on the main body 46 of the nipple 22, which is itself fastened to the lower cap 44 of the cover 32, the subassembly 101 can be demounted, without the need to demount the drive means 62.

This makes it possible to provide subassemblies 101 which are interchangeable as a function of the shape of the neck 14 of the container 12, without the need to modify the drive means 62 and/or the main body 46 of the nipple 22.

Moreover, the operation of changing the subassembly 101 is especially simple since it is sufficient to cause the lower cap 44 of the cover 32 to tilt downward.

The gripping means 26 according to the invention make it easier to personalize the treatment station 11 as a function of the shape of the containers 12 to be treated.

It will be noted that the nipple 22 is provided with a plurality of seals, which have not all been designated, in order to ensure vacuum pumping in the container 12 and leaktight closing of the treatment enclosure 34.

Preferably, a proximity sensor (not illustrated), which is arranged on the cover 32, detects the moments when the control cuff 56 is to be controlled into the gripping or the release position. This proximity sensor may be connected electrically to a solenoid valve which controls the pressure in the control chamber 100, thus making it possible to control the gripping means 26 directly by means of the proximity sensor, without the need to go via the control unit of the treatment station 11 or of the machine 10.

By virtue of the gripping means 26 according to the invention, it is not necessary to apply a holding force in order to keep the control cuff 56 in the locked position, since this position corresponds to a stable position of rest due to the action of the springs 64.

Moreover, in the machine 10 according to the invention, it is not necessary to exert force on the container 12 in order to release it or in order to grasp it.

The invention claimed is:

1. A machine for the treatment of containers by depositing a barrier-forming internal coating by microwave plasma, said machine comprising at least one treatment station, each treatment station comprising:
   an enclosure for containing the container, the container including a container lip and a container neck, wherein a microwave plasma field is emitted inside the enclosure from a microwave field generator; and
   a cover mounted axially slidably with respect to the enclosure,
   the cover comprising i) a nipple equipped with a gripping means for grasping the container externally by the container neck, so as to allow axial insertion of the container into the enclosure, ii) a vacuum-pumping chamber, and iii) a leaktight connection means for connecting the interior of the container and the vacuum-pumping chamber, the leaktight connection means comprising
   a cartridge having a substantially tubular shape and mounted coaxial with respect to the container neck and forming a leaktight contact with the container lip when grasped by the gripping means, the cartridge comprising an axial connection portion having radial ports extending inside the vacuum-pumping chamber, the vacuum-pumping chamber communicating with the interior of the cartridge via the radial ports,
   wherein, the microwave field emitted inside the enclosure gives causes deposits a barrier-forming internal coating on the containers, and dimensions of each radial port prevent the microwave plasma, emitted inside the container during the treatment, from diffusing toward the vacuum-pumping chamber.

2. The machine as claimed in claim 1, wherein an axial wall of the connection portion comprises at least one window, and each window is shut off by means of an attached axial wall element in which the radial ports are arranged.

3. The machine as claimed in claim 2, wherein the axial wall element comprising a perforated cuff attached inside the cartridge.

4. The machine as claimed in claim 1, wherein the cartridge comprises an axial portion forming a tubular spacer, the spacer is inserted axially between the container lip and the connection portion of the cartridge and is fastened to an associated axial end of the connection portion.

5. The machine as claimed in claim 4, wherein, the cartridge comprises an annular sealing ring which makes the leaktight connection between the cartridge and the container lip, and the sealing ring is fastened to the opposite axial end of the spacer to the connection portion.

6. The machine (10) as claimed in claim 5, wherein, the gripping means comprise a tubular supporting cuff coaxial with respect to the container neck, the supporting cuff mounted in a receptacle of the cover, and the supporting cuff comprises a concave axial wall having a shoulder arranged to come to bear axially against the annular sealing ring of the cartridge.

7. The machine as claimed in claim 1, wherein, the cartridge comprises, on the opposite side to the container, an axial end junction portion, and the junction portion comprises a solid axial wall and is in leaktight contact with the body of an injector for injecting a reaction fluid into the container during treatment.

8. The machine as claimed in claim 7, wherein the junction portion has a substantially cylindrical shape, and the cartridge comprises a cylindrical sleeve arranged against the concave axial wall of the junction portion, the sleeve extending substantially over the entire axial length of the junction portion.

9. The machine as claimed in claim 8, wherein the junction portion and the connection portion are produced in one piece, and they form the main body of the cartridge.

10. The machine as claimed in claim 1, wherein the cartridge is mounted in a complementary receptacle of the cover, the cover comprises a locking member provided with radial bearing means movable between a locked position and a release position, and the cartridge comprises an outer radial collar arranged to be clamped axially between an associated portion of the cover and the bearing means of the locking member when in the locked position, so as to retain the cartridge in the mounted position in the receptacle of the cover.

* * * * *